United States Patent
Kim

(10) Patent No.: US 8,565,362 B2
(45) Date of Patent: Oct. 22, 2013

(54) CLOCK RECOVERY APPARATUS

(75) Inventor: Sang Seob Kim, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 209 days.

(21) Appl. No.: 12/972,314

(22) Filed: Dec. 17, 2010

(65) Prior Publication Data

US 2011/0158366 A1    Jun. 30, 2011

(30) Foreign Application Priority Data

Dec. 29, 2009  (KR) .................. 10-2009-0132594

(51) Int. Cl.
*H04L 7/00*    (2006.01)

(52) U.S. Cl.
USPC ........... 375/371; 375/316; 375/354; 375/356; 375/373; 375/375; 375/376

(58) Field of Classification Search
USPC ......... 375/316, 354, 355, 356, 371, 373, 375, 375/376
See application file for complete search history.

(56) References Cited

U.S. PATENT DOCUMENTS

| | | | |
|---|---|---|---|
| 7,173,462 B1 * | 2/2007 | Wang | 327/158 |
| 7,995,698 B2 * | 8/2011 | Liu et al. | 375/376 |
| 8,116,418 B2 * | 2/2012 | Chien | 375/373 |
| 2002/0090043 A1 * | 7/2002 | Cho | 375/371 |
| 2003/0210758 A1 * | 11/2003 | Lee et al. | 375/371 |
| 2004/0036516 A1 * | 2/2004 | Kim | 327/165 |
| 2009/0196387 A1 * | 8/2009 | McCune, Jr. | 375/355 |
| 2009/0237534 A1 * | 9/2009 | Okumura | 348/294 |

FOREIGN PATENT DOCUMENTS

| | | |
|---|---|---|
| JP | 08-32566 A | 2/1996 |
| JP | 10-199162 A | 7/1998 |

OTHER PUBLICATIONS

Makoto Hashimoto and Takashi Hiyama; "Signal Reproducing Device"; Abstract of Publication No. JP10199162 (A); Publication Date: Jul. 31, 1998; espacenet database—Worldwide.

Shunji Sato and Yuki Takahashi; "Clock Supply Circuit"; Abstract of Publication No. JP8032566 (A); Publication Date: Feb. 2, 1996; espacenet database—Worldwide.

* cited by examiner

*Primary Examiner* — Siu Lee
(74) *Attorney, Agent, or Firm* — Murabito Hao & Barnes LLP; Andrew D. Fortney

(57) ABSTRACT

A clock recovery apparatus includes a mask generator configured to generate a plurality of time masks using a multi-phase clock signal and a clock recovery unit configured to select one of the time masks to recover a clock from a data stream.

20 Claims, 4 Drawing Sheets

CLOCK RECOVERY APPARATUS

This application claims the benefit of Korean Patent Application No. 10-2009-0132594, filed on Dec. 29, 2009, which is hereby incorporated by reference in its entirety as if fully set forth herein.

BACKGROUND OF THE INVENTION

1. Field of the Invention

The present invention relates to a serial interfacing technique, and more particularly, to a clock recovery apparatus in which a clock embedded in data is recovered by using multiple time masks (windows).

2. Discussion of the Related Art

In the field of flat panel displays (FPD), panel size, the number of pixels, and operating speed have been sharply increased. As a result, the amount of data has also been increased. Therefore, it is necessary to improve the performance at a data receiving end to process the data substantially simultaneously.

A conventional interface, such as multipoint-low voltage differential signaling (m-LVDS) or LVDS, separately transmits the clock and the data. In the serial interface that separately transmits the clock and the data, as the data rate increases, timing skew between the clock and the data may adversely affect correct data transmission.

In recent years, a clock-embedded serial interface that transmits a clock embedded in data has been proposed.

FIG. 1 is a view illustrating a clock recovery structure of a conventional clock-embedded serial interface.

In the clock embedded serial interface of FIG. 1, a transmitting end transmits data having a clock embedded therein, and a receiving end extracts and recovers the clock from the data.

A phase locked loop/delay locked loop (PLL/DLL) 10 generates multi-phase clocks. A mask generator 20 generates a time mask using the multi-phase clocks at a time when a clock is extracted from data. As a result, the clock is accurately recovered by positioning the time mask at the corresponding timing or phase.

Specifically, the mask generator 20 generates the time mask using the multi-phase clocks generated by the PLL/DLL 10, and an AND gate 30 receives the original input data and the time mask generated by the mask generator 20 and recovers the clock.

At this time, the generated time mask is positioned to be synchronized with the clock or the cover a rising edge and a falling edge of the clock, so that the clock is recovered irrespective of a value of the data region.

However, process, voltage, and temperature (PVT) conditions act as considerable variables in clock recovery and can cause severe variations in clock recovery conditions. Therefore, stable clock recovery may not be performed efficiently or correctly.

Specifically, even if the time masks are ideally generated using the multi-phase clocks of the PLL/DLL 10 (which are not independent of PVT conditions), a time delay generated during generation of the time mask can vary depending on the PVT conditions, so that the time mask is not accurately positioned.

When the time delay depending on the PVT conditions is greater than a predetermined setting amount, the recovered clock is output later than the original timing, which increases the amount of jitter of the PLL/DLL 10. Consequently, an error in clock recovery may gradually increase, and therefore, an error rate in data recovery may also gradually increase.

On the other hand, when the time delay is smaller than the predetermined setting amount, the recovered clock may be output earlier than the original timing, which can also increase the amount of jitter of the PLL/DLL 10. Consequently, the clock and the data may not be properly recovered.

For this reason, the position of the time mask should be gradually and/or manually corrected in view of the respective PVT conditions. Therefore, a new apparatus for performing such operations is proposed.

SUMMARY OF THE INVENTION

Accordingly, the present invention is directed to a clock recovery apparatus that substantially obviates one or more problems due to limitations and disadvantages of the related art.

To achieve these objects and other advantages and in accordance with the purpose of the invention, as embodied and broadly described herein, an object of the present invention is to provide a clock recovery apparatus in which the clock is properly recovered in view of the process, voltage, and/or temperature conditions (hereinafter, "PVT conditions").

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

One aspect of the present invention provides a clock recovery apparatus that includes a mask generator configured to generate a plurality of time masks using a multi-phase clock signal and a clock recovery unit configured to select one of the time masks to recover a clock from a data stream. The clock recovery apparatus may further include a phase locked loop/delay locked loop configured to generate the multi-phase clock signal.

The clock recovery unit may include a mask selection unit configured to select one of the time masks and a logic gate (e.g., an AND gate) configured to recover the clock from the data stream using the selected time mask.

The mask selection unit may include a delay calculator configured to estimate a delay of the clock in the data stream and generate a mask selection control signal, and a mask selector configured to select one of the time masks according to the mask selection control signal. The delay calculator may include two or more flip-flops configured to receive two or more time masks and delay calculation logic configured to receive outputs from the flip-flops, calculate the delay of the clock, and output the mask selection control signal. The time masks may have the same or different phase difference therebetween.

The clock recovery apparatus may have an operation period including a training period and an active period, and one of the time masks may be selected during the training period. One of the time masks may be selected when two neighboring time masks have different logic levels at a rising edge or a falling edge of the clock in the data stream.

Another aspect of the present invention provides a clock recovery apparatus that includes a mask generator configured to generate a plurality of time masks and a clock recovery unit configured to select one of the time masks according to a delay of the time masks and recover a clock in a data stream using the selected time mask.

The clock recovery unit may select one of the time masks based on a combination of the delay of the time masks and the clock in the data stream.

The clock recovery unit may include a mask selection signal generator configured to generate a mask selection control signal based on the combination of the delay of the time masks and the clock in the data stream and a mask selector configured to select one of the time masks according to the mask selection control signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

A clock recovery apparatus according to an exemplary embodiment of the present invention is preferably used in a clock-embedded serial interface.

Figure 1:
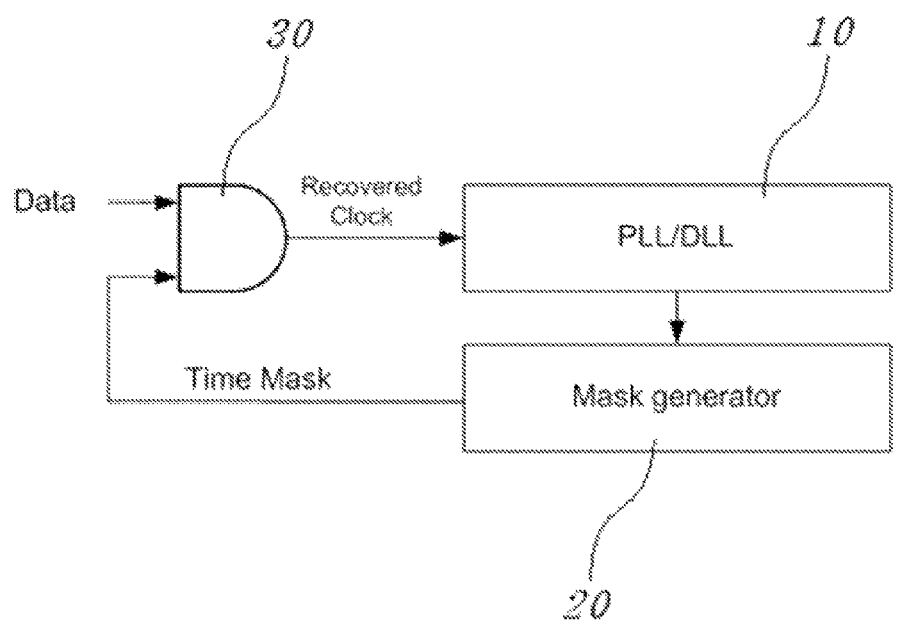
FIG. 1 is a diagram illustrating a clock recovery structure of a conventional clock embedded-serial interface.
Figure 2:
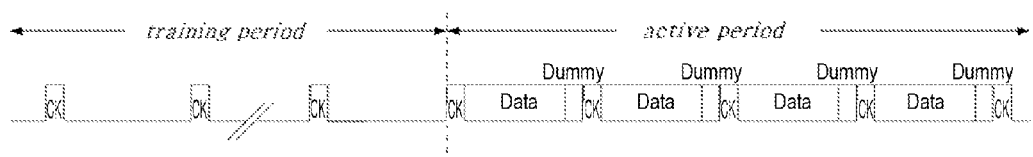
FIG. 2 is a timing diagram illustrating an example of a serial interface protocol for explaining a clock recovery method according to the present invention.

FIG. 2 is a timing diagram illustrating a serial interface protocol for explaining a clock recovery method according to an exemplary embodiment of the present invention.

As shown in FIG. 2, a transmission period of the clock embedded serial interface can be divided into a training period, in which only a clock signal is transmitted, and an active period in which data (including a dummy signal or dummy time period) and a clock signal are transmitted.

The active period includes a data section, a dummy section, and a clock section. Here, a section may be referred to as a time period. Data is transmitted during the active period as a data stream (e.g., serially).

Using the clock recovery method according to an exemplary embodiment of the present invention, the clock is recovered in both the training period and the active period.

In the training period, a plurality of sequential time masks Q1 to Q10 (e.g., adjacent to each other in time) is generated using multi-phase clocks. Although 10 masks are used in this example, any number of masks (e.g., 4 or more) may be used.

The time delay is calculated based on the generated time masks, and one appropriate time mask is selected from among the generated time masks in view of the calculated time delay.

The time mask selection may be performed based on states (e.g., binary high or low states) of the time masks at a rising edge or a falling edge of the clock transmitted in the training period. That is, the delay state according to the PVT conditions is judged based on the states (high or low) of the time masks at the rising edge or the falling edge of the clock, and a suitable time mask is selected according to the delay state. For example, one of the time masks is selected when two neighboring time masks have different logic levels at a rising edge or a falling edge of the clock in the data stream.

The delay according to the PVT conditions is generated according to the process condition, the applied voltage condition, and/or the temperature condition in a semiconductor process. For example, when a manufacturing process is slow, the applied voltage decreases, or the operating temperature increases, a response speed of a switching element such as a transistor becomes slow, causing a delay. The PLL/DLL is locked by selecting one time mask that may match the delay.

In the active period, the clock is recovered using the time mask selected in the training period, and data stream is sampled using the recovered clock to recover serial data.

Of course, even in the active period, a plurality of sequential time masks (e.g., adjacent to each other in time) can be generated using multi-phase clocks at a time when the clock signal and the data are separated from each other. The data stream is sampled using the time mask selected in the training period (e.g., from among all of the generated time masks), so that the serial data are recovered.

For example, a plurality of time masks generated in the training period and the active period may include first to M-th time masks, where M is an integer of at least 2 (e.g., 4, 8, 10, 16, 128, etc.). The time masks have different time delays, depending on the number of multi-phase clocks generated. For example, as compared with a (K−1)-th time mask, a K-th ($1 \leq K \leq M$) time mask may be generated with a predetermined time delay. That is, as compared with the (K−1)-th time mask, the K-th time mask may be generated with a time delay corresponding to the number of the multi-phase clocks. For example, when the number of multi-phase clocks correspond to a ½ unit of information (UI), the time masks may be generated at time intervals of ½ UI (or a phase difference of 90°). Here, the UI indicates a time length of one bit in a serial data stream.

When the multi-phase clocks are generated corresponding to ½ UI, a clock used for sampling to recover data may be generated corresponding to every ½ UI. That is, the interval between adjacent multi-phase clocks is preferably equal to the interval between adjacent sampling clocks for data recovery.

As another example, a product in which a sampling clock for data recovery is generated corresponding to every 1/N UI may further include a multi-phase clock having intervals corresponding to the 1/N UI, where N is an integer of at least 2.

In an exemplary embodiment of the present invention, as described above, the clock is recovered in the active period during data transmission using the time mask selected in the training period.

Meanwhile, it is assumed that each of the dummy region and the clock region between the data regions correspond to a time of 1 UI, respectively.

Figure 3:
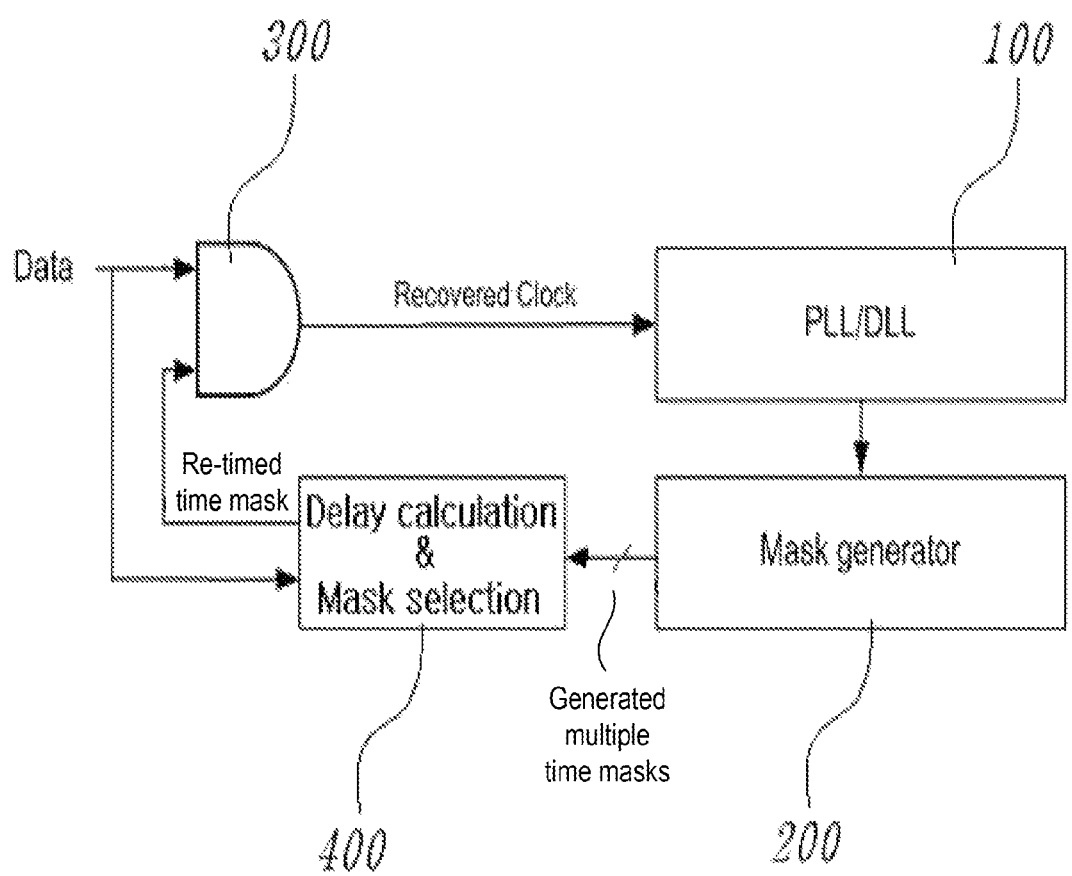
FIG. 3 is a diagram illustrating a clock recovery apparatus for a clock-embedded serial interface according to an exemplary embodiment of the present invention.

FIG. 3 is a view illustrating a clock recovery apparatus for the clock embedded serial interface according to an exemplary embodiment of the present invention.

Figure 4:
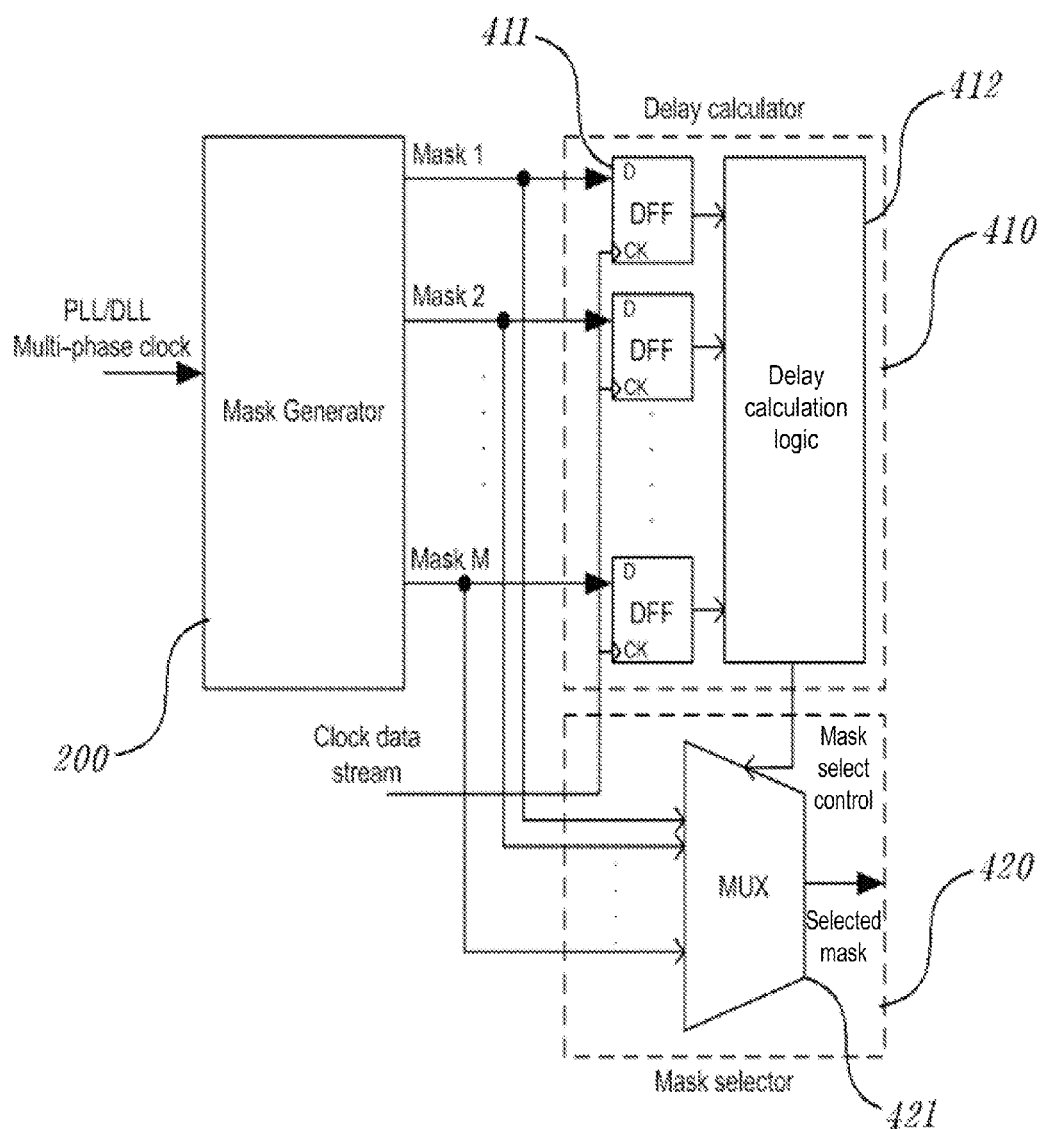
FIG. 4 is a diagram illustrating a clock recovery apparatus according to an exemplary embodiment of the present invention.

FIG. 4 illustrates a block diagram of a clock recovery apparatus according to an exemplary embodiment of the present invention.

The clock recovery apparatus shown in FIGS. 3 and 4 includes a delay calculator 410 and a mask selector 420 which may detect and compensate for the PVT condition according to variation in the PVT condition.

Figure 5:
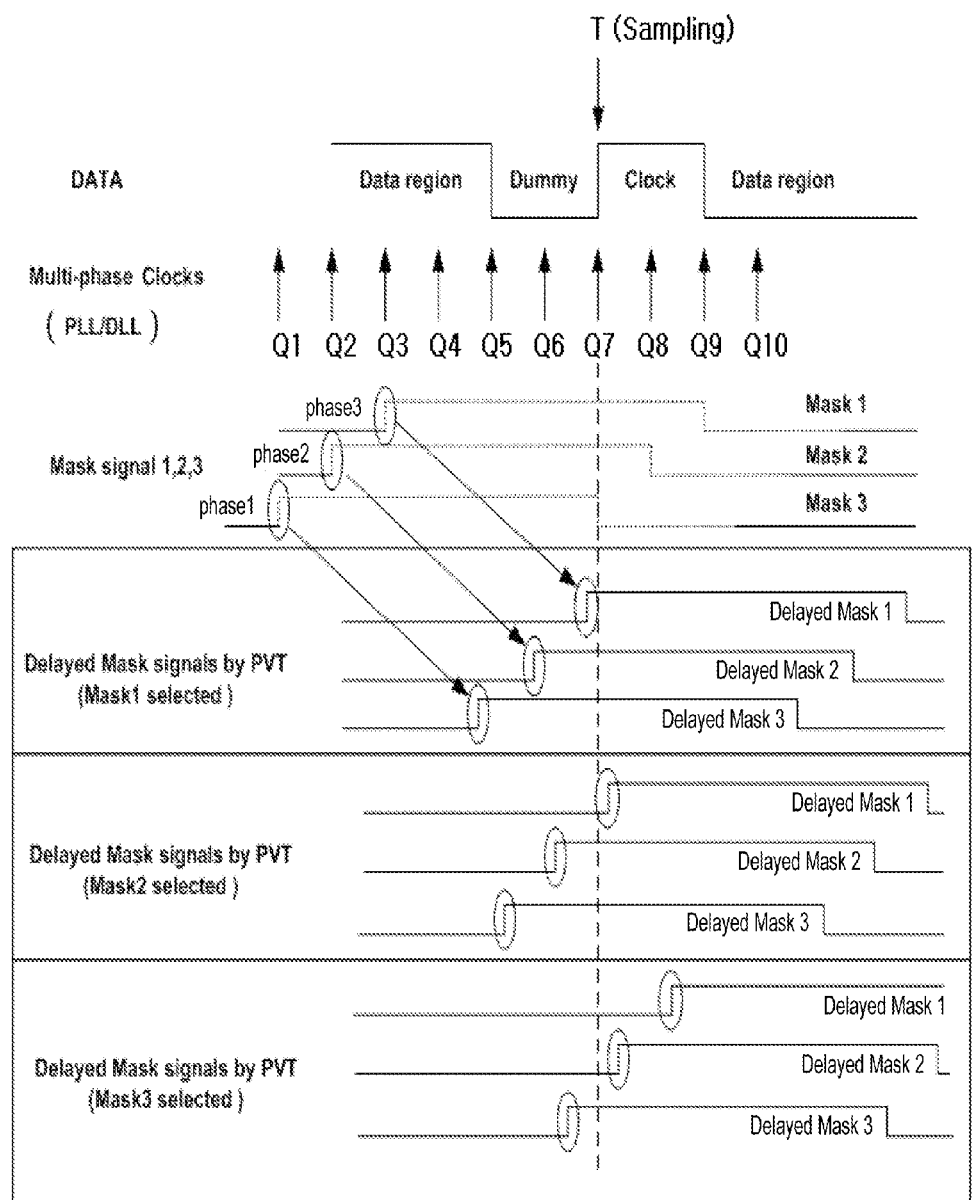
FIG. 5 is a timing diagram illustrating an example of clock recovery using a clock recovery apparatus according to an exemplary embodiment of the present invention.

FIG. 5 is a timing diagram illustrating a clock recovery method using the clock recovery apparatus according to an exemplary embodiment of the present invention.

In an exemplary embodiment of the present invention, the position of the time mask is gradually compensated according to the PVT conditions during clock recovery. At this time, variations in the PVT conditions are very random and thus not easy to estimate. It is not easy to solve the problem even if the condition is manually set from the outside. Therefore, the position of the time mask changes according to the variation of the PVT condition. To this end, as shown in FIG. 3, a delay calculation and mask selection unit 400 is provided.

A PLL/DLL 100 generates the multi-phase clocks. For example, the multi-phase clocks may be generated at a time interval corresponding to ½ UI.

A mask generator 200 generates a plurality of time masks at a time when the clock is separated from data using the multi-phase clocks generated by the PLL/DLL 100. The time masks are adjacent to each other in time. That is, the mask generator 200 generates a plurality of time masks adjacent to each other in time using the multi-phase clocks generated by the PLL/DLL 100.

For example, the time masks are generated using the multi-phase clocks. The time masks have different time delays corresponding to time delays between the multi-phase clocks. That is, as previously described, one time mask may be generated with a delay corresponding to the number of multi-phase clocks as compared with a previous time mask. Additional time masks may be generated from the multi-phase clocks by passing each multi-phase clock through a delay circuit having a characteristic fractional delay related to the bit length (e.g., K/M of the bit length, where K and M are each an integer and K<M, such as ¼, ¾, ⅕, ⅖, etc.).

As shown in FIG. 4, the delay calculation and mask selection unit 400 includes a delay calculator 410 and a mask selector 420. The delay calculation and mask selection unit 400 selects and outputs a time mask which is most suitable for current PVT conditions among the plurality of time masks in view of the delay information (e.g., the various delay values) in the plurality of time masks that have been generated by the mask generator 200.

Preferably, the delay calculator 410 and the mask selector 420 select one of the time masks in the training period. Even in the active period in which data are transmitted after the training period, the delay calculator 410 and the mask selector 420 may select one of the time masks in view of the delay according to PVT conditions. Preferably, an operation of selecting the time mask in the active period is performed as the data stream is received during the data section.

An operation of selecting the time mask in view of the delay according to the PVT conditions is as follows. The mask generator 200 generates a plurality of time masks Mask 1 to Mask M having different time delays from the multi-phase clocks generated by the PLL/DLL 100.

The delay calculator 410 includes a plurality of parallel flip-flops (DFF) 411 at an input end thereof to which the time masks are input. Also, the delay calculator 410 has a delay calculation logic 412 that may calculate or estimate a PVT delay based on outputs of the flip-flops (DFF) 411.

The outputs of the flip-flops (DFF) 411 are input into the delay calculation logic 412 in parallel, along with the clock data stream from which the clock signal is recovered. That is, each of the flip-flops (DFF) 411 outputs a bit corresponding to the time delay of the time masks Mask 1 to Mask M relative to a transition of the clock data stream. Consequently, bit values from the flip-flops (DFF) 411 are input to the delay calculation logic 412. For example, the three the flip-flops (DFF) 411 output a 3-bit signal (e.g., "111," "011," or "001") to the delay calculation logic 412.

The delay calculation logic 412 outputs a calculation result of the time delay (e.g., a result of estimating a clock delay in the data stream) to the mask selector 420. The calculation result is a time mask selection control signal.

In particular, the delay calculation logic 412 calculates or estimates the time delay by sampling the plurality of time masks at a rising edge T of the embedded clock (e.g., the clock signal component of the clock data stream). Subsequently, the mask selector 420 outputs one selection control signal based on the calculated or estimated time delay.

For example, referring to FIG. 5, when a sampling value at the rising edge T of the clock data stream (e.g., the embedded clock) is "111," the selection control signal for selecting the first mask Mask 1 is output.

When a sampling value at time T of the rising edge of the embedded clock is "011," the selection control signal for selecting the second mask Mask 2 is output. When the sampling value at the rising edge T of the embedded clock is "001," the selection control signal for selecting the third mask Mask 3 is output.

Referring back to FIG. 4, the time masks Mask 1 to Mask M having different time delays generated by the mask generator 200 are also input to the mask selector 420. The mask selector 420 outputs one of the time masks according to a time mask selection control signal. The mask selector 420 may include a multiplexer (MUX) 421 for selecting one of the time masks. The clock in the data stream is recovered using the selected time mask. Referring back to FIG. 3, the present apparatus may include, for example, a logic gate (e.g., an AND gate) 310 configured for clock recovery from the data stream (including the embedded clock) using the selected time mask. For example, the AND gate 300 recovers the clock by ANDing (or outputting the logical product of) the data stream (including the data) and the time mask selected by the mask selector 420.

As a result, an accurate and stable clock can be recovered by positioning the time mask at the corresponding timing.

The mask selector 420 judges the degree (or phase) of delay calculated or estimated by the delay calculator 410 according to the PVT conditions in the training period and selects one of the time masks. An optimum time mask is selected as follows. The delay states of the time masks are fetched at the rising edge of the embedded clock, and one time mask is selected based on an arrangement of the fetch values.

An example of selecting an appropriate time mask when delay changes according to the PVT conditions will be described with reference to FIG. 5.

When the first mask Mask 1 is selected, all of the states of the first to third masks at the rising edge T of the embedded clock have a high level H. When the second mask Mask 2 is selected, the states of the second and third masks at the rising edge T of the embedded clock have a high level H, and the state of the first mask has a low level L. When the third mask Mask 3 is selected, the third mask at the rising edge T of the embedded clock has a high level H, and the first and second masks have a low level L.

In conclusion, when all of the delayed first to third masks at the rising edge T of the embedded clock have a high value, it is judged that delay is minimum, and therefore, the first mask is used as the time mask for clock recovery.

When the first mask has a low value L and the second and third masks have a high value at the rising edge T of the embedded clock, it is judged that delay is normal, and therefore, the second mask is used as the time mask for clock recovery.

When the first and second masks have a low value L and the third mask has a high value at the rising edge T of the embedded clock, it is judged that delay is maximum, and therefore, the third mask having the largest delay is used as the time mask for clock recovery.

As described above, the time mask is selected by fetching the plurality of time masks delayed at a predetermined interval at the rising edge of the embedded clock and confirming the values of the time masks at the rising edge of the clock data stream, including the embedded clock.

The clock recovery apparatus according to one or more exemplary embodiments of the present invention is provided for a clock embedded serial interface. In particular, the clock recovery apparatus further includes a delay calculation/estimation and mask selection unit for correction of the recovered clock signal according to PVT conditions, thereby preventing an error from occurring due to variation of the PVT conditions in the clock embedded serial interface and thus improving the clock recovery performance. Consequently, the clock recovery apparatus has the stable clock recovery performance.

In particular, according to one or more exemplary embodiments of the present invention, an optimum one of the time masks is selected according to variations in the PVT conditions, leading to stable clock recovery and data recovery. Also, selection of the time mask is automatically performed by the clock recovery apparatus without changing any settings (e.g., of an external variable), thereby improving reliability.

Also, utilization of conventional technology can be maximized by adding the delay calculation block and the mask selection block, with little change of circuit construction or design.

Also, since the clock and the data are transmitted through a single line, a high-speed serial interface can be implemented, and timing skew may not occur (or may be minimized) between the clock and the data.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A clock recovery apparatus, comprising:
a mask generator configured to generate a plurality of time masks using a multi-phase clock signal; and
a clock recovery unit comprising a mask selection unit configured to select one of the time masks and a logic gate configured to recover a clock from a data stream.

2. The clock recovery apparatus according to claim 1, further comprising a phase locked loop or delay locked loop configured to generate the multi-phase clock signal.

3. The clock recovery apparatus according to claim 1, wherein the logic gate comprises an AND gate receiving the data stream and the selected time mask.

4. The clock recovery apparatus according to claim 1, wherein the mask selection unit comprises:
a delay calculator configured to estimate a delay of the clock in the data stream and generate a mask selection control signal; and
a mask selector configured to select one of the time masks according to the mask selection control signal.

5. The clock recovery apparatus according to claim 4, wherein the delay calculator comprises:
two or more flip-flops configured to receive two or more time masks; and
delay calculation logic configured to receive outputs from the flip-flops, calculate the delay of the clock, and output the mask selection control signal.

6. The clock recovery apparatus according to claim 1, wherein adjacent time masks have a same phase difference therebetween.

7. The clock recovery apparatus according to claim 1, wherein adjacent time masks have different phase differences therebetween.

8. The clock recovery apparatus according to claim 1, wherein the clock recovery apparatus has an operation period including a training period and an active period, and one of the time masks is selected during the training period.

9. The clock recovery apparatus according to claim 1, wherein one of the time masks is selected when two neighboring time masks have different logic levels at a rising edge or a falling edge of the data stream.

10. A clock recovery apparatus, comprising:
a mask generator configured to generate a plurality of time masks using a multi-phase clock signal; and
a clock recovery unit configured to select one of the time masks and recover a clock from a data stream using the selected time mask, wherein one of the time masks is selected when two neighboring time masks have different logic levels at a rising edge or a falling edge of the data stream.

11. The clock recovery apparatus of claim 10, wherein the clock recovery unit further selects one of the time masks according to a delay of the time masks.

12. The clock recovery apparatus according to claim 11, wherein the clock recovery unit selects one of the time masks based on a combination of the delay of the time masks and the clock in the data stream.

13. The clock recovery apparatus according to claim 12, wherein the clock recovery unit comprises:
a mask selection signal generator configured to generate a mask selection control signal based on the combination of the delay of the time masks and the clock in the data stream; and
a mask selector configured to select one of the time masks according to the mask selection control signal.

14. A method of recovering a clock signal from a data stream having an embedded clock, comprising:
generating a plurality of time masks from a multi-phase clock signal; and
selecting one of two adjacent time masks according to a delay of the time masks and a transition of the data stream between the two adjacent time masks, wherein the adjacent time masks are separated by 1/N of a unit of information, and N is an integer of at least two; and
recovering a clock from the data stream using the selected time mask.

15. The method according to claim 14, further comprising generating the multi-phase clock signal from a phase locked loop or a delay locked loop.

16. The method according to claim 14, wherein the unit of information is a data bit.

17. The method according to claim 14, wherein recovering the clock from the data stream comprises logically combining the data stream and the selected time mask.

18. The method according to claim 17, wherein logically combining the data stream and the selected time mask comprises receiving the data stream and the selected time mask in an AND gate.

19. The method according to claim 14, wherein selecting the one of two adjacent time masks is based on a combination of the delay of the time masks and the clock in the data stream.

20. The method according to claim 19, wherein selecting one of two adjacent time masks further comprises:
- generating a mask selection control signal based on the combination of the delay of the time masks and the clock in the data stream; and
- selecting the one of two adjacent time masks according to the mask selection control signal.

* * * * *